(12) United States Patent
Schottker et al.

(10) Patent No.: US 7,473,316 B1
(45) Date of Patent: Jan. 6, 2009

(54) METHOD OF GROWING NITROGENOUS SEMICONDUCTOR CRYSTAL MATERIALS

(75) Inventors: Bernd Schottker, Aachen (DE); Michael Heuken, Aachen (DE); Holger Jürgensen, Aachen (DE); Gerd Strauch, Aachen (DE); Bernd Wachtendorf, Hsin-Chu (TW)

(73) Assignee: Aixtron AG (DE)

( * ) Notice: Subject to any disclaimer, the term of this patent is extended or adjusted under 35 U.S.C. 154(b) by 1826 days.

(21) Appl. No.: 09/624,252

(22) Filed: Jul. 24, 2000

(30) Foreign Application Priority Data

Apr. 12, 2000 (DE) .................................. 100 18 128

(51) Int. Cl.
*C30B 25/16* (2006.01)
(52) U.S. Cl. .................... 117/89; 117/101; 117/102; 117/104; 117/952
(58) Field of Classification Search .................... 117/89, 117/101, 102, 104, 95.2
See application file for complete search history.

(56) References Cited

U.S. PATENT DOCUMENTS 5,602,418 A * 2/1997 Imai et al. .................... 257/627
5,637,146 A * 6/1997 Chyi ............................ 117/200
6,072,189 A * 6/2000 Duggan ........................ 257/14
6,252,255 B1 * 6/2001 Ueta et al. ..................... 257/94
2001/0024871 A1 * 9/2001 Yagi .............................. 438/604

FOREIGN PATENT DOCUMENTS

JP 4-187597 * 7/1992
JP 10-149992 * 6/1998

OTHER PUBLICATIONS

Ambacher et al, "Thermal Stability and desorption of Group III Nitrides . . . " J. Vac. Sci Tech. B 14(6) pp. 3532-3542, Nov./Dec. 1996.*

* cited by examiner

*Primary Examiner*—Robert Kunemund
(74) *Attorney, Agent, or Firm*—St.Onge Steward Johnston & Reens LLC

(57) ABSTRACT

What is described here is a process for the initial growth of nitrogenous semiconductor crystal materials in the form $A_xB_yC_zN_vM_w$ wherein A, B, C is an element of group II or III, N is nitrogen, M represents an element of group V or VI, and X, Y, Z, W denote the molar fraction of each element of this compound, using a, which are deposited on sapphire, SiC or Si, using various ramp functions permitting a continuous variation of the growth parameters during the initial growth.

8 Claims, 1 Drawing Sheet

METHOD OF GROWING NITROGENOUS SEMICONDUCTOR CRYSTAL MATERIALS

The present invention relates to a method of growing nitrogenous semiconductor crystal materials corresponding to the form $A_XB_YC_ZN_VM_W$, wherein A, B, C is an element of group II or III, N is nitrogen, M represents an element of group V or VI, and X, Y, Z, W denote the molar fraction of each element of this compound, using an intermediate stratum as growth substrate e.g. on sapphire, SiC or Si.

The hetero epitaxial growth of semiconductors of binary, ternary or quaternary compounds on sapphire, SiC or Si of the form $A_XB_YC_ZN_VM_W$, wherein A, B, C is an element of group II or III, N is nitrogen, M represents an element of group V or VI, and X, Y, Z, W denote the molar fraction of each element of this compound, is a growth process which is difficult to control on account of the high lattice mis-matching, because the initial growth takes a decisive influence on the ongoing growth development. The crystal quality of an epitaxial semiconductor stratum is hence strongly dependent on this initial growth. In an approach to circumvent the problems involved in the initial growth, a novel initial growth procedure has been developed which varies from the known method.

The method so far employed is based on a two-step initial growth process which is composed of a low-temperature growth step, also known as buffer layer growth, and the subsequent high-temperature growth step [JP/B2/93]. In that method the growth regime variation, i.e. the transition from the cubic into the hexagonal crystal structure, is a striking factor for the interruption of the growth process between the two temperature regimes, it being assumed that re-crystallisation takes place in the low-temperature buffer layer [BOY98], [MTF+98], [WKT+96].

Due to the manifold variations of the growth parameters, this two-step initial growth process is sensitive in terms of reproducibility of the nucleation strata and sensitive to irregularities over the wafer. This takes a substantial influence on the characteristics of the devices made from this material. The luminance and colour of a LED becomes difficult to control by the two-step method. The electrical direct current and high-frequency characteristics of FET elements are subject to very strong variations.

This corresponds to the current state of the art for the manufacture of high-quality materials for nitrogenous semiconductor materials such as GaN, InGaN, AlGaN, GaAsN, i.e. semiconductors in the form $A_XB_YC_ZN_VM_W$ (wherein A, B, C is an element of group II or III, N is nitrogen, M represents an element of group V or VI, and X, Y, Z, W denote the molar fraction of each element of this compound) can, however, also be produced in a different manner.

In correspondence with prior art, in the production of nitrogenous semiconductor strata resulting from the initial growth and the ongoing growth of strata [WFT+98], [HNB+97], [GNL96], first a stratum is deposited at low temperatures. Then growth is interrupted and the temperature is increased. During this period, the crystal structure changes. Only upon completion of the process the further growth can take place. The quality and the electrical and optical properties of the strata then following are extremely dependent on the fact that the required temperatures, pressures, intervals, etc. are observed.

The present invention is based on the problem of providing a method permitting the initial growth of nitrogenous semiconductor crystal materials in the form $A_XB_YC_ZN_VM_W$, wherein A, B, C is an element of group II or III, N is nitrogen, M represents an element of group V or VI, and X, Y, Z, W denote the molar fraction of each element of this compound, which permit a two-dimensional epitaxial growth of the foreign substrates such as sapphire, SiC or Si without any abrupt change of the growth regime.

In this method the complex production process is avoided which is based on the known two-step growth of strata consisting of a buffer layer grown at low substrate temperatures and of a further growth on this buffer layer at a higher temperature. Advantages of the new method are a better reproducibility and lower production costs for electronic devices.

This means that an optimum matching of the growth parameters during the initial growth is intended to prevent an abrupt change of the growth regime and to realise a quicker and more robust initial growth at a comparable or better crystalline quality of the semiconductor stratum, thus opening up new technological potentials for new devices.

The novel initial growth procedure therefore prevents the two-step growth of strata and thus avoids the production process involving a great number of necessary steps of method. As a consequence, the manufacturing period and the costs of a nitrogenous semiconductor crystal stratum are reduced. At the same time, improved structural, electrical and optical characteristics are achieved.

With the three-dimensional mesa structure, which is created after re-crystallisation (heating up to a higher temperature after the growth of the buffer layer), producing a decisive effect for the ongoing growth and hence for the global quality of the stratum, this process is an important element of the initial growth phase. During the initial growth using the ramp functions it is therefore indispensable that these decisive growth effects are an integral part of the ramp function. This is achieved by the adaptation of the growth rate, which is directly correlated with the Ga flow, to the heating ramp function of the substrate. Other important process parameters such as total flow and total pressure must be adjusted appropriately.

In other words, the growth rate and hence the Ga flow must be so selected that in situ re-crystallisation can occur during the growth phase.

In this method it is necessary that the critical thickness of the stratum of the nitrogenous semiconductor material on sapphire, SiC or Si will have reached the critical stratum thickness before re-crystallisation takes place during the heating process. The problem of the invention consists in the production of a first stratum on a substrate. This stratum produces a continuing effect on the strata then following. This means that the objective is not only a definition of the composition, doping and succession of strata but also the additional possibility to permit an optimum matching of the strata then following, with due consideration of further desirable characteristics which will be described in the following. It is an aim to avoid complex production processes involving a great number of steps of operation. As a consequence, the production period and the production costs are reduced.

The problem underlying the invention is solved by a method defined in Claim 1. Improvements of the inventive method are the subject matters of the Claims 2 to 8. The problem supporting the invention is solved by a continuous growth process. On account of the expedient features of the solution defined in the method Claim 1 it is possible to produce defined strata, junctions, specifically between the substrate and the active area, and successions of strata or hetero structures and structures, respectively, of these semiconductor crystal materials with adjustable electrical and optical properties such as compositions X, Y, Z, V, W of the compound from zero to 100%, specific electrical electron concentrations up to $10^{20}$ cm$^{-3}$ and specific electrical hole concentrations up to $8\times10^9$ cm$^{-3}$.

$A_XB_YC_ZN_VM_W$ materials and stratified systems as well as doped stratified systems can now be expediently produced.

It is expediently possible now to achieve a high homogeneity even in a lateral direction.

A further advantage is the possibility to achieve a high degree of reproducibility.

The advantageous production of devices has now become possible.

An expedient production of quantum wells is now possible.

Moreover, n-type and p-type doping can be implemented at the same time.

A reproducible production of $A_XB_YC_ZN_VM_W$ materials of different X, Y, Z, V, W compositions and different levels of purity can now be expediently made possible.

Another advantage is the possible production of junctions between $A_{1X}B_{1Y}C_{1Z}N_{1V}M_{1W}/A_{2X}B_{2Y}C_{2Z}N_{2V}M_{2W}$ layers with adjustable transition profiles which can be reproduced without any restriction.

Another characteristic which can be predetermined in an expedient manner is the topographic morphology of the semiconductor materials.

Further properties which can be expediently predetermined are the particle density and the impurity density on the wafer surface.

Another advantage resides in the fact that a reproducible and highly homogeneous or uniform application of $A_XB_YC_ZN_VM_W$ components can now be achieved in relation to doping, thickness of the layer, composition and all other characteristics which are important for applications.

What is described here is a method permitting the initial growth of nitrogenous semiconductor crystal materials having the form $A_XB_YC_ZN_VM_W$ (wherein A, B, C represent a group II or group III element, N denotes nitrogen, M represents a group V or group VI element, and X, Y, Z, W represent each the molar fraction of each element in this compound) on sapphire, SiC and Si, using different ramp functions permitting a continuous variation of the growth parameters during the initial growth.

This new initial growth method excels itself by the aspects that during the initial growth process of the nitrogenous semiconductor crystal materials on sapphire, SiC or Si an abrupt change of the growth regime is not required in order to implement an appropriate structure for the further high-temperature growth.

The present invention will now be described, without any limitation of the general inventive idea, by exemplary embodiments with reference to the drawing which is referred to explicitly in all other respects as far as the disclosure of all inventive details is concerned which are not explained in a more detailed form in the text.

Example of the Initial Growth

For the initial growth, the $Al_2O_3$ substrate had previously been heated to 1200° C. in a hydrogen atmosphere (15.0 mbar) for 30 minutes. Following this desorption step the substrate temperature was then reduced to 530° C. so as to ensure a reproducible starting situation for the further growth. Then an $NH_3$ flow was passed into the reactor at a flow rate of 4500 sccm at that temperature. Starting out from that substrate temperature, then a linear ramp function was applied (from 530° C. to 1200° C. within 8 minutes) in order to reach the common high growth temperature. In the moment in which the heating function commenced then TMGa was passed, at a reduced flow rate of 20 sccm, into the reactor, which results in a GaN growth at a low growth rate.

After the regular growth temperature had been reached, a stratum was allowed to grow at a reduced growth rate for 4 minutes. Then a ramp function (linear ramp of the TMGa flow rate from 20 sccm to 80 sccm throughout 15 minutes) was applied again in order to increase the TMGa flow so as to avoid a continuing three-dimensional growth and to achieve a continuous higher growth rate in correspondence with the known growth rates of 2 μm/h. Then a GaN stratum, 2 μm thick, and a quintuple MQW GaInN/GaN stratum were deposited on this matching stratum.

FURTHER EMBODIMENTS

Comparison of the known growth conditions and the novel technology proposed here; the following stratified structure is used as test structure:

5×2 nm InGaN/15 nm GaN

2 μm GaN:Si buffer layer 20 nm GaN nucleation layer

400 μm sapphire substrate (0001)

Figure 1:
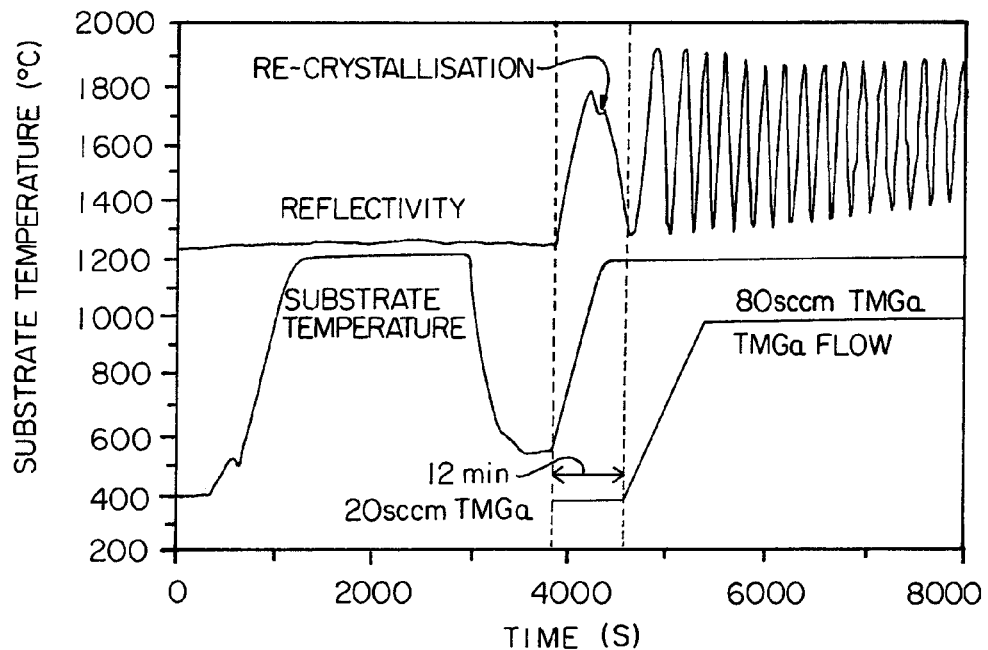
FIG. 1 is a graph showing Reflectivity and Substrate Temperature as a Function of Time.
Figure 2:
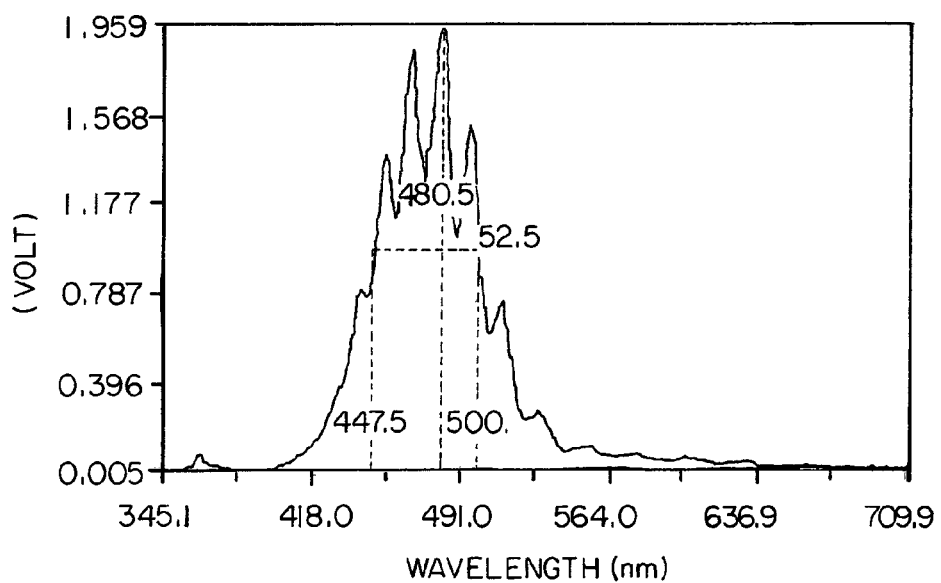
FIG. 2 is a graph showing PL spectrum obtained with the quintuple MQW GaInN/GaN deposited on the new initial growth stratum.

The evaluation of the optical characteristics is presented in FIG. 2.

The distinction resides in the growth of the first nucleation layer on the substrate. In the known growth process the first nucleation layer is deposited at 530° C. under an $N_2$ atmosphere at 950 mbar for 8 minutes. The stratum presents cubic elements and is not coherent. Following the deposition of the stratum the growth is interrupted and heating is continued up to 1170° C. Then a healing step is performed for 2 minutes. During this step re-crystallisation from the cubic crystal phase to the hexagonal phase takes place. The growth of the GaN buffer layer is then performed at 1160° C. In the novel method of the present invention a continuous growth takes place during the step of heating from 530° C. to 1170° C. without any interruption of the growth and without any healing step which would permit re-crystallisation. The growth therefore takes place in an $H_2$ atmosphere at 200 mbar. The comparison of the properties presented in FIG. 2 reveals a higher light yield at a constant emission wavelength.

REFERENCES

[JP/B2/93] Patent held by Shuji, Nakamura
  NICHIA Kagaku Kogyo Kabushiki Kaisha
  Japanese Patent Office, Published Patent Application B2
    Patent Number: 2778405

[BOY98] K. Balakrishnan, H. Okumura, S. Yoshida
  Study of initial stages of hetero-epitaxial growth of hexagonal GaN on sapphire by plasma-assisted MBE
  J. Cryst. Growth 189/190, pp. 244 et seq. (1998)

[HNB+97] J. Han, T. B. Ng, R. M. Biefeld, M. H. Crawford and D. M. Follstaedt
  The effect of $H_2$ on morphology evolution during GaN metal-organic chemical vapour deposition
  Appl. Phys. Lett. 71(21), pp. 3114 et seq., (1997)

[MTG+98] A. Munholm, C C. Thompson, C. M. Foster, J. A. Eastman, O. Auciello, G. B. Stephenson, P. Fini, S. P. Den Baars and J. S. Speck
  Determination of the cubic to hexagonal fraction in GaN nucleation layers using grazing incidence X-ray scattering
  Appl. Phys. Lett. 72(23), pp. 2972 et seq., (1998)

[OMAB98] T. Onitsuka, T. Maruyama, K. Akimoto and Y. Bando
Interface structure of GaN on sapphire (0001) studied by transmission electron microscope
J. Cryst. Growth 189/190, pp. 295 et seq., (1998)

[WFT+98] X. H. Wu, P. Fini, E. J. Tarsa, B. Heying, S. Keller, U. K. Mishra, S. P. Den Baars, J. S. Speck
Dislocation generation in GaN hetero-epitaxy
J. Cryst. Growth 189/190, pp. 231 et seq., (1998)

[KWH+98] D. D. Koleske, A. E. Wickenden, R. L. Henry, M. E. Twigg, J. C. Culberton and R. J. Gorman
Enhanced GaN decomposition in $H_2$ near atmospheric pressure
Appl. Phys. Lett. 73(14), pp. 2018 et seq., (1998)

[GML96] N. Grandjean, J. Massies and M. Leroux
Nitridation of sapphire. Effect on the optical properties of GaN epitaxial overlayers
Appl. Phys. Lett. 69(14), pp. 2071 et seq., (1996)

The invention claimed is:

1. MOCVD process for the initial growth of nitrogenous semiconductor crystal materials in the form of $A_xB_yC_zN_vM_w$ wherein A, B, C, is an element of group II or III, N is nitrogen, M represents an element of group V or VI, and X, Y, Z, W denote the molar fraction of each element of this compound, which are deposited on sapphire, SiC or Si, characterized in that the deposition of these semiconductor materials is performed in a continuous growth process from the first moment of wafer covering up to the achievement of a high-quality stratum on the surface, whereby the growth starts at a low initial growth temperature, which increases by means of a ramp function to the common high growth temperature.

2. Process according to claim 1,
characterised by a continuous variation of the substrate temperature for the purpose of continuously re-structuring during said continuous growth of the aforementioned materials and the gas flow by ramp functions during the initial growth so as to achieve a quicker reproducible nucleation.

3. Process according to claim 1,
characterised by controlling the defect density in said semiconductor stratum by continuous variation of the growth regime (cubic or hexagonal) during the initial growth by means of ramp functions and the continuous variation of the growth rate by way of variation of the gas phase concentration, of the total pressure or by continuous variation of other important growth factors.

4. Process according to claim 1,
characterized by controlling the stress density in the semiconductor crystal by a continuous variation of the growth regime during the initial growth by means of ramp functions.

5. Process according to claim 1,
characterised in that said continuous variation of the temperature can be described by the function T(t):

$$T(t)=t_0+a_1t+a_2t^2+a_3t^3+\ldots+a_nt^n.$$

6. Process according to claim 1,
characterised by a continuous variation of process parameters or process conditions influencing said hexagonal or cubic growth.

7. Process according to claim 1,
characterised by other methods of controlling the dislocation density in the crystal so that the transition from cubic growth to hexagonal growth takes place continuously.

8. Process according to claim 1,
characterised by the expedient production of opto-electronic and electronic devices and other elements such as LEDs or lasers displaying an enhanced homogeneity of the properties, intensity, electrical characteristics and emission wavelengths, as the properties of said nucleation layer according to the claim 1 is insensitive to temperature variations and variations in the gas phase composition.

* * * * *